(12) United States Patent
Zhang et al.

(10) Patent No.: US 9,446,524 B2
(45) Date of Patent: Sep. 20, 2016

(54) WIRE CLAMP WITH PIEZOELECTRIC ACTUATOR AND METHOD AND APPARATUS FOR APPLYING A PRELOAD FORCE TO THE PIEZOELECTRIC ACTUATOR

(71) Applicants: Yue Zhang, Singapore (SG); Chong Hao Chen, Singapore (SG); Zheng Yu Lin, Singapore (SG)

(72) Inventors: Yue Zhang, Singapore (SG); Chong Hao Chen, Singapore (SG); Zheng Yu Lin, Singapore (SG)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 257 days.

(21) Appl. No.: 14/079,840

(22) Filed: Nov. 14, 2013

(65) Prior Publication Data

US 2015/0128405 A1    May 14, 2015

(51) Int. Cl.
| | | |
|---|---|---|
| *B25J 15/02* | (2006.01) | |
| *B25J 15/00* | (2006.01) | |
| *H01L 23/00* | (2006.01) | |
| *E02D 3/054* | (2006.01) | |

(52) U.S. Cl.
CPC ......... *B25J 15/0028* (2013.01); *B25J 15/0033* (2013.01); *B25J 15/0042* (2013.01); *H01L 24/74* (2013.01); *H01L 24/78* (2013.01); *H01L 24/85* (2013.01); *E02D 3/054* (2013.01); *H01L 2224/45099* (2013.01); *H01L 2224/78* (2013.01); *H01L 2924/00014* (2013.01); *Y10T 29/49998* (2015.01); *Y10T 29/5323* (2015.01); *Y10T 29/53222* (2015.01); *Y10T 29/53226* (2015.01); *Y10T 29/53257* (2015.01); *Y10T 29/53283* (2015.01)

(58) Field of Classification Search
CPC .............. B25J 15/0028; B25J 15/0033; B25J 15/0042; H01L 24/74; H01L 24/78; H01L 24/85; H01L 2224/78; H01L 2224/45009; H01L 2924/00014; E02D 3/054; Y10T 29/49998; Y10T 29/53222; Y10T 29/53226; Y10T 29/5323; Y10T 29/53257; Y10T 29/53283
See application file for complete search history.

(56) References Cited

U.S. PATENT DOCUMENTS

| | | | | |
|---|---|---|---|---|
| 2005/0279805 | A1* | 12/2005 | Wong | ...... H01L 24/78 228/4.5 |
| 2010/0300752 | A1* | 12/2010 | Winter, V | ...... E02D 3/054 175/19 |

FOREIGN PATENT DOCUMENTS

JP          05259213 A    * 10/1993

* cited by examiner

*Primary Examiner* — A. Dexter Tugbang
(74) *Attorney, Agent, or Firm* — Ostrolenk Faber LLP

(57) ABSTRACT

A wire clamp includes a clamp body; a pair of arms coupled to the clamp body; and a piezoelectric actuator having a longitudinal axis extending between a first end and a second end, the actuator being coupled to the pair of arms at the first end and to the clamp body at the second end. The second end of the actuator is coupled to the clamp body by a preload mechanism for applying a preload force along the longitudinal axis, and the preload mechanism comprises at least one wedge having an inclined surface which is slidable over a mating inclined surface.

7 Claims, 9 Drawing Sheets

WIRE CLAMP WITH PIEZOELECTRIC ACTUATOR AND METHOD AND APPARATUS FOR APPLYING A PRELOAD FORCE TO THE PIEZOELECTRIC ACTUATOR

TECHNICAL FIELD

This invention relates to a wire clamp with a piezoelectric actuator, and to a method and an apparatus for applying a preload force to the piezoelectric actuator.

BACKGROUND OF THE INVENTION

In semiconductor processing, an integrated circuit is connected to its packaging by wires in a process known as wire bonding. During wire bonding it is necessary to clamp the wire to be bonded in order to position it precisely at the desired location. One known device for clamping wires is shown in FIG. 1, and includes a pair of jaws 102, 104 which are driven by a piezoelectric actuator 110. Applying an electric field across the actuator 110 causes the jaws 102, 104 to open. When the electric field is switched off, the arms close such that the wire is clamped between clamping plates 106, 108.

When using piezoelectric actuators it is necessary to apply a preload force to the piezoelectric element of the actuator before an electric field is applied. The magnitude of the preload force is important. If insufficient preload is applied, the piezoelectric element may break due to dynamic pull forces. If too much preload is applied, the actuator may not be able to successfully actuate.

In the wire clamp of FIG. 1, a preload force is applied by using a set screw 130 to apply a force to the piezo actuator 110, along its longitudinal axis (i.e, the axis running along the centre of the piezo actuator 110 and perpendicular to its ends 112, 114) via a preload block 120. The set screw 130 and preload block 120 push the piezo actuator 110 against the wire clamp main body 105.

A disadvantage of the prior art arrangement shown in FIG. 1 is that the screw 130 may become loose due to vibration or insufficient friction in the mating surfaces (i.e. between the screw 130 and preload block 120, and between the preload block 120 and piezo 110), resulting in a decrease of the preload force on the piezo actuator 110, and adversely affecting the performance of the wire clamp 100. In typical operation of a wire bonding apparatus employing the clamp 100, an external force will repeatedly be applied to the preloading screw 130 in the axial direction, which may cause the screw to loosen.

A further disadvantage of the preload mechanism of FIG. 1 is that a torque will be transmitted to the piezo stack 110 as the screw is tightened. This may damage the piezo stack 110 if not done carefully.

It would be desirable to provide a wire clamp which overcomes one or more of the above disadvantages, or which at least provides a useful alternative.

SUMMARY OF THE INVENTION

Embodiments relate to a wire clamp, comprising:
a clamp body;
a pair of arms coupled to the clamp body; and
a piezoelectric actuator having a longitudinal axis extending between a first end and a second end, the actuator being coupled to the pair of arms at the first end and to the clamp body at the second end;
wherein the second end of the actuator is coupled to the clamp body by a preload mechanism for applying a preload force along the longitudinal axis, and
wherein the preload mechanism comprises at least one wedge having an inclined surface which is slidable over a mating inclined surface.

Other embodiments relate to a method of applying a preload force to a piezoelectric actuator of a wire clamp, the wire clamp comprising a clamp body and a pair of arms coupled to the clamp body, the piezoelectric actuator having a longitudinal axis extending between a first end and a second end and being coupled to the pair of arms at the first end and to the clamp body at the second end; the method comprising the steps of:
providing a wedge having an inclined surface;
providing a mating inclined surface such that a gap is defined between the mating inclined surface and the piezoelectric actuator, or between the clamp body and the mating inclined surface, the wedge being slidable over the mating inclined surface;
inserting the wedge into the gap such that the inclined surface contacts the mating inclined surface; and
applying a force to the wedge in a direction transverse to the longitudinal axis of the actuator to thereby apply a preload force along the longitudinal axis.

Further embodiments relate to a jig for applying a preload force to a piezoelectric actuator of a wire clamp, the wire clamp comprising: a clamp body and a pair of arms coupled to the clamp body, the piezoelectric actuator having a longitudinal axis extending between a first end and a second end and being coupled to the pair of arms at the first end and to the clamp body at the second end, the second end of the piezoelectric actuator being coupled to the clamp body by a preload mechanism for applying a preload force along the longitudinal axis, the preload mechanism comprising at least one wedge having an inclined surface which is slidable over a mating inclined surface; the jig comprising:
a clamp support having a recess to receive the clamp body;
a tensioning platform extending from the clamp support and being elevated relative to the recess, the tensioning platform having a threaded bore which, when the clamp body is received in the clamp support, is aligned with the at least one wedge; and
a tensioning screw receivable in the threaded bore such that a tip of the tensioning screw contacts the at least one wedge, and such that tightening of the tensioning screw applies a force to the at least one wedge in a direction transverse to the longitudinal axis of the piezoelectric element.

BRIEF DESCRIPTION OF THE DRAWINGS

Embodiments of the invention will now be described, by way of non-limiting example only, with reference to the accompanying drawings in which.

DETAILED DESCRIPTION OF EMBODIMENTS

Figure 1:
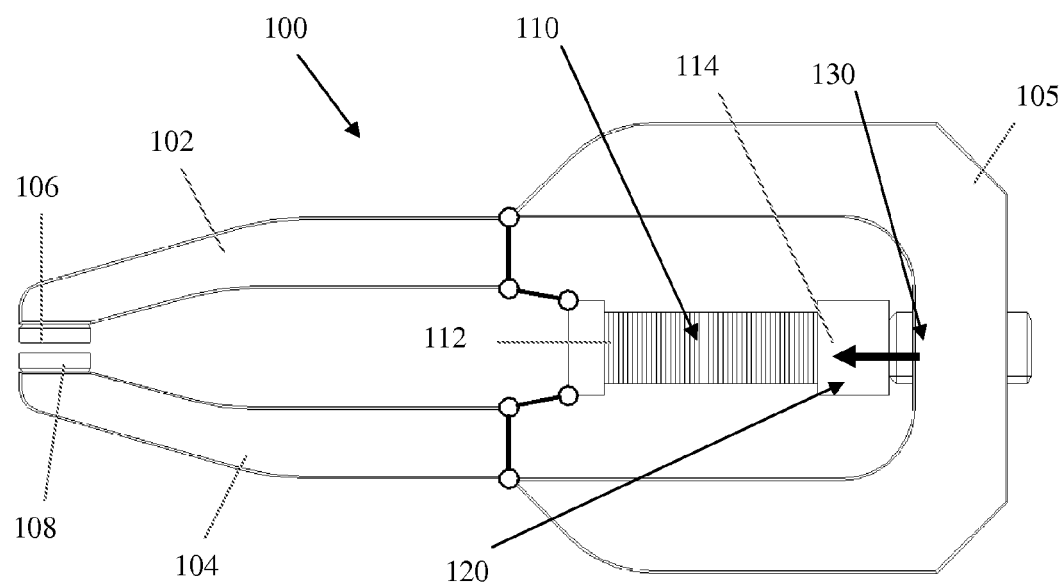
FIG. 1 is a projection view from above of a prior art wire clamp.
Figure 2:
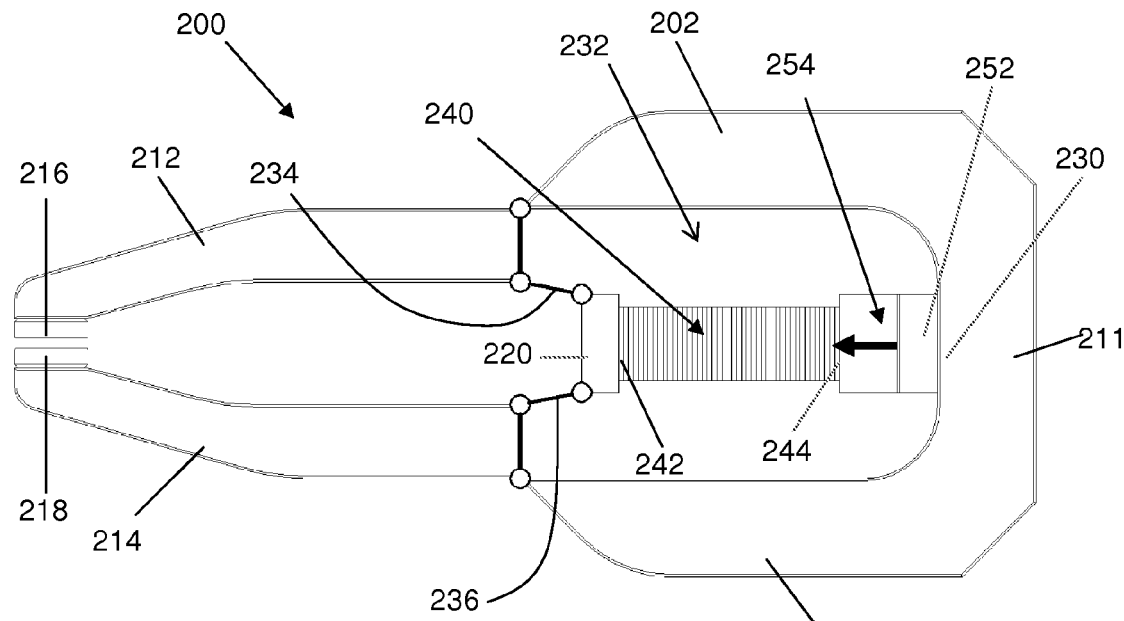
FIG. 2 is a projection view from above of a wire clamp according to some embodiments of the invention.
Figure 3:
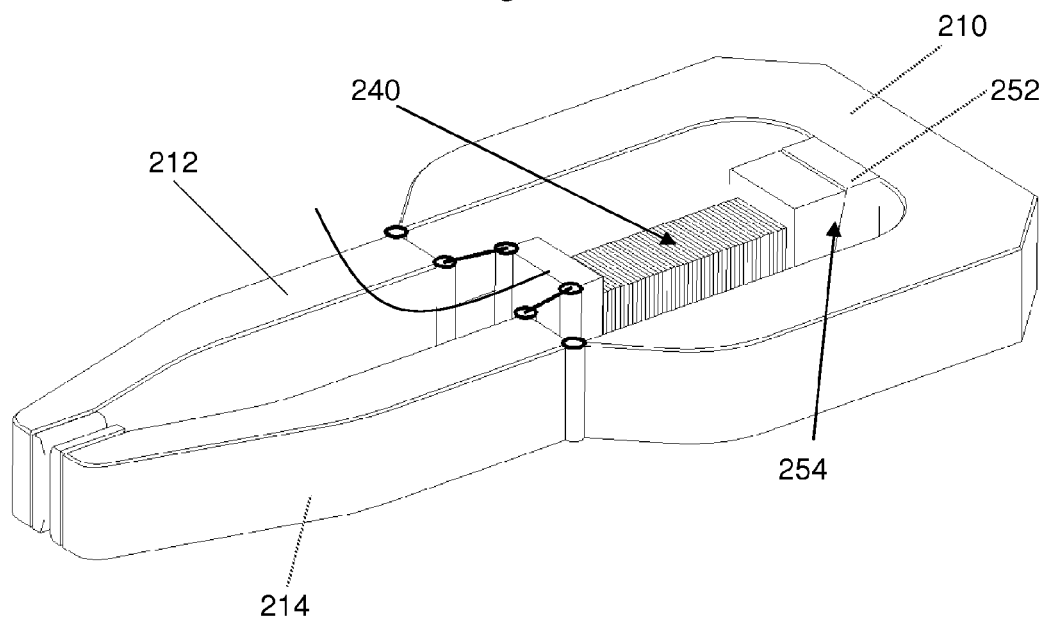
FIG. 3 is a top perspective view of the wire clamp of FIG. 2.

Referring initially to FIG. 2 and FIG. 3, there is shown a wire clamp 200 having a body 210, within which is disposed a piezoelectric actuator 240. The piezoelectric actuator 240 is preferably a multilayer stack actuator. The body 210 is substantially U-shaped and has an end portion 211 extending between two side portions 202 and 204. The end portion 211 and side portions 202, 204 together define a void 232 within which the actuator 240 resides.

The actuator 240 contacts, at a distal end 242, a plate 220. The plate 220 is coupled to jaws 212, 214 via respective linkages 234, 236. Jaw 212 has a clamp plate 216 and jaw 214 has a clamp plate 218. Application of an electric field to the actuator 240 in a direction along the longitudinal axis results in an expansion of the actuator, thus exerting a force on plate 220, and in turn causing the jaws 212, 214 to be opened (via linkages 234, 236).

The actuator 240 may be fastened at its distal end 242 to the plate 220, or may be separate from the plate 220 such that it is simply in abutment with it.

At a proximal end 244, the actuator 240 contacts a preload mechanism comprising wedge elements 252, 254, which are interposed in a gap between the proximal end 244 and an inner surface 230 of the body 210. Wedge element 254 may be fastened to proximal end 244 of actuator 240. Alternatively, wedge element 252 may be fastened to the body 210 or may be integral with it such that it extends from inner surface 230. In presently preferred embodiments, both wedge elements 252, 254 are separate from the actuator 240 and body 210. Body 210 may have a support surface 208 (FIG. 6) extending between its sides 202, 204 (for example), on which the wedge element 254 is supported.

The terms "distal" and "proximal" in relation to the ends of actuator 240 are used to indicate their relationship to the end portion 211 of body 210. That is, the "proximal" end 244 is the end which is closer to end portion 211 while the "distal" end 242 is the end which is further away.

Figure 4:
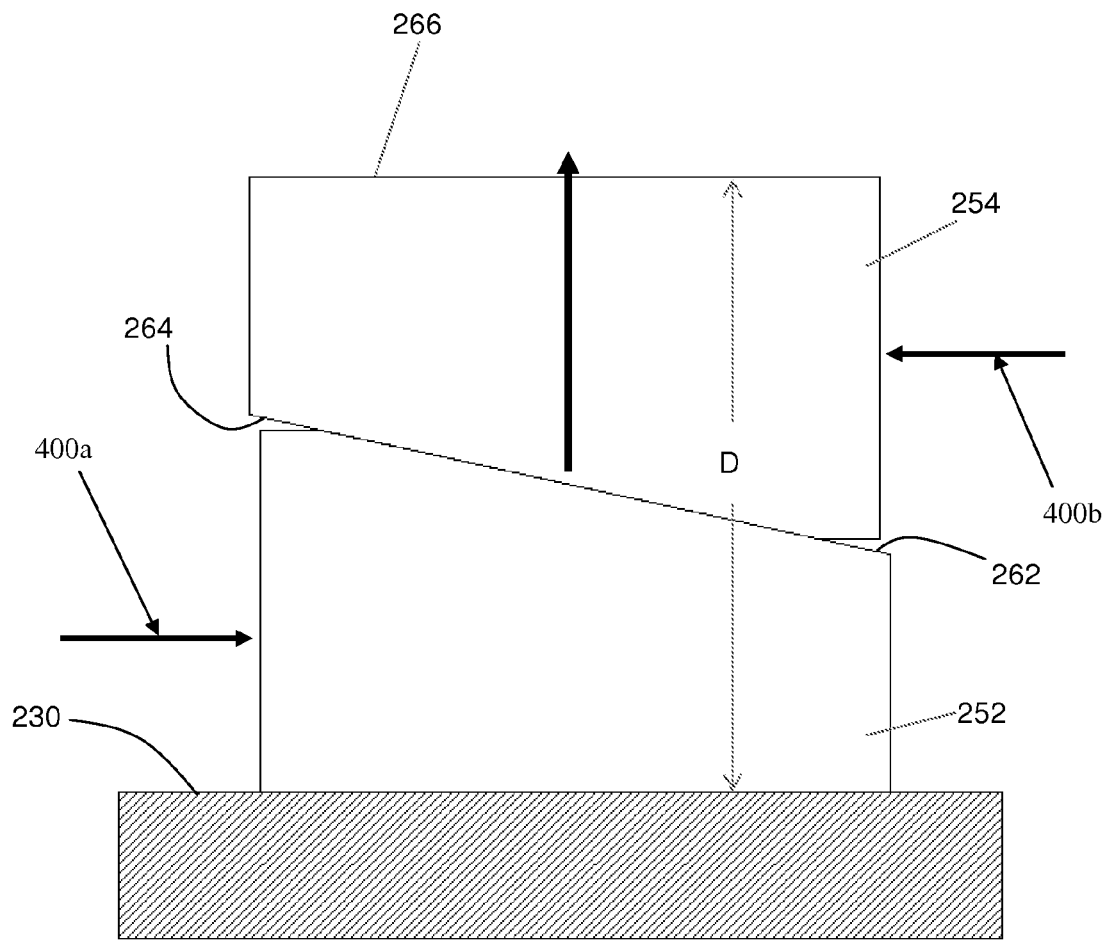
FIG. 4 is a side view, in close-up, of a preload mechanism according to certain embodiments.

As shown in FIG. 4, wedge 252 has an inclined surface 262 and wedge 254 has a mating inclined surface 264. Surfaces 262, 264 are able to slide over each other when a transverse force 400a or 400b is applied to wedge 252 or wedge 254. Wedge 254 is supported on the support surface of the body 210 during application of the transverse force. Due to the angle of inclination of the surfaces, as a force 400a or 400b is applied, the flat-to-flat distance D between the respective flat surfaces of the wedges 252, 254 increases. As the distance D increases, the preload force (reaction force) applied to actuator 240 increases.

Transverse force 400a or 400b may continue to be applied until a desired preload force is achieved. When the desired preload force is achieved, the wedges 252, 254 may be secured together, for example by gluing or soldering, in order to maintain the desired preload force.

In presently preferred embodiments, the wedges 252, 254 are self-locking. Self-locking is achieved when:

$$\mu > \tan \theta, \tag{1}$$

where $\mu$ is the coefficient of static friction between the wedges 252, 254, and $\theta$ is the angle of inclination of inclined surface 264 to flat surface 266 of wedge 254 (or equivalently, the angle of inclination of inclined surface 262 of wedge 252).

The self-locking behaviour of the wedges 252, 254 is particularly advantageous, because the preload force applied to the piezo actuator 240 is more stable than that achievable by the screw-tensioning methods of the prior art. The performance of the piezo wire clamp 200 is therefore more consistent than prior art clamps.

The angle $\theta$ is preferably in the range 8-12 degrees although it will be appreciated that for self-locking, any angle which satisfies the self-locking condition (1) will suffice. For wedges which are not self-locking, other angles of inclination may be possible.

The embodiment shown in FIGS. 2 to 4 employs two wedges 252, 254 in the preload mechanism. It will be appreciated that a single wedge 252 or 254 may be employed provided a suitable mating inclined surface is provided at the proximal end 244 or at the inner surface 230 as appropriate. Alternatively, in some embodiments three or more wedges may be used, provided that the surface of the wedge contacting proximal end 244 of the actuator 240 is flat so that the preload force is directed along the longitudinal axis of the actuator 240.

Figure 5:
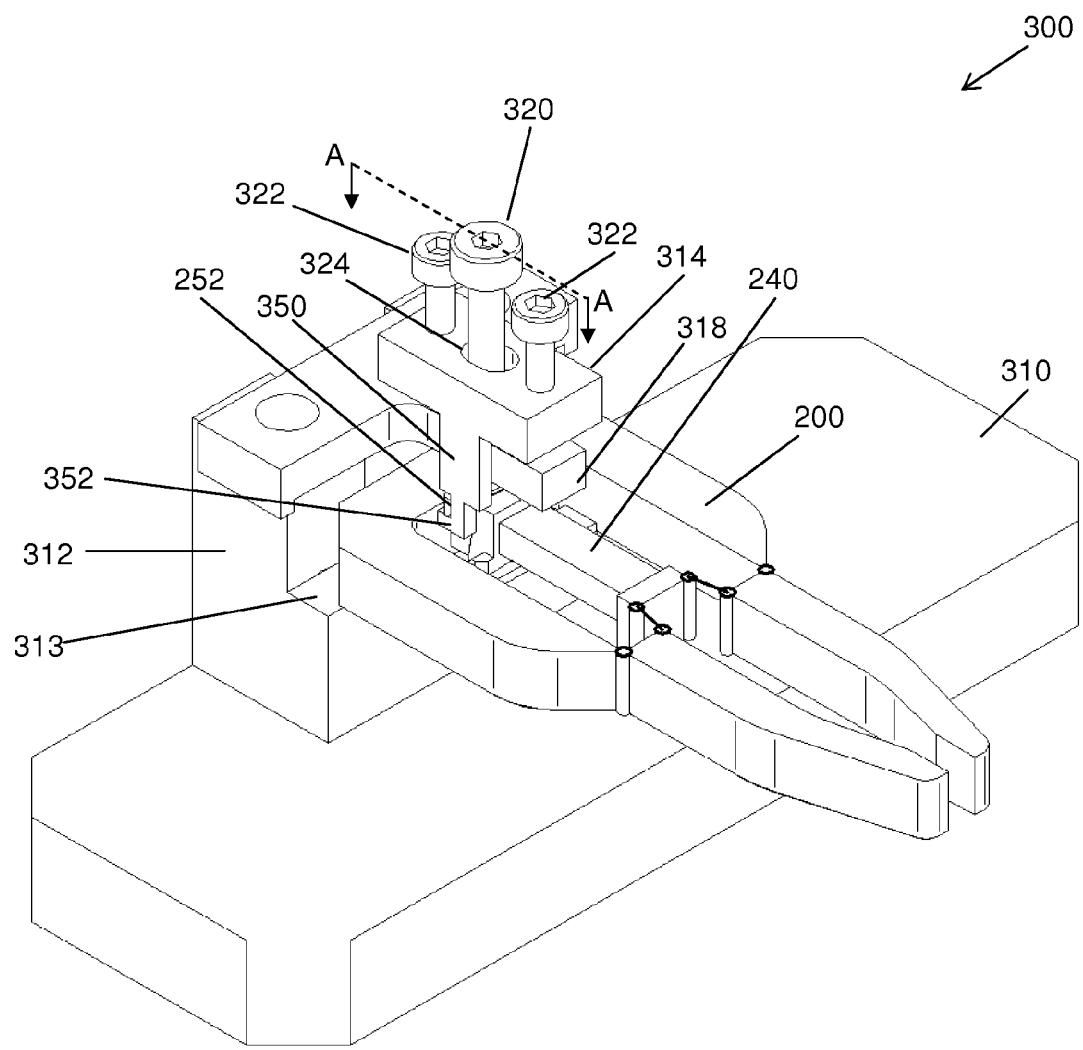
FIG. 5 is a top perspective view of the wire clamp of FIGS. 2 to 4, positioned in a jig for adjusting the preload force.
Figure 6:
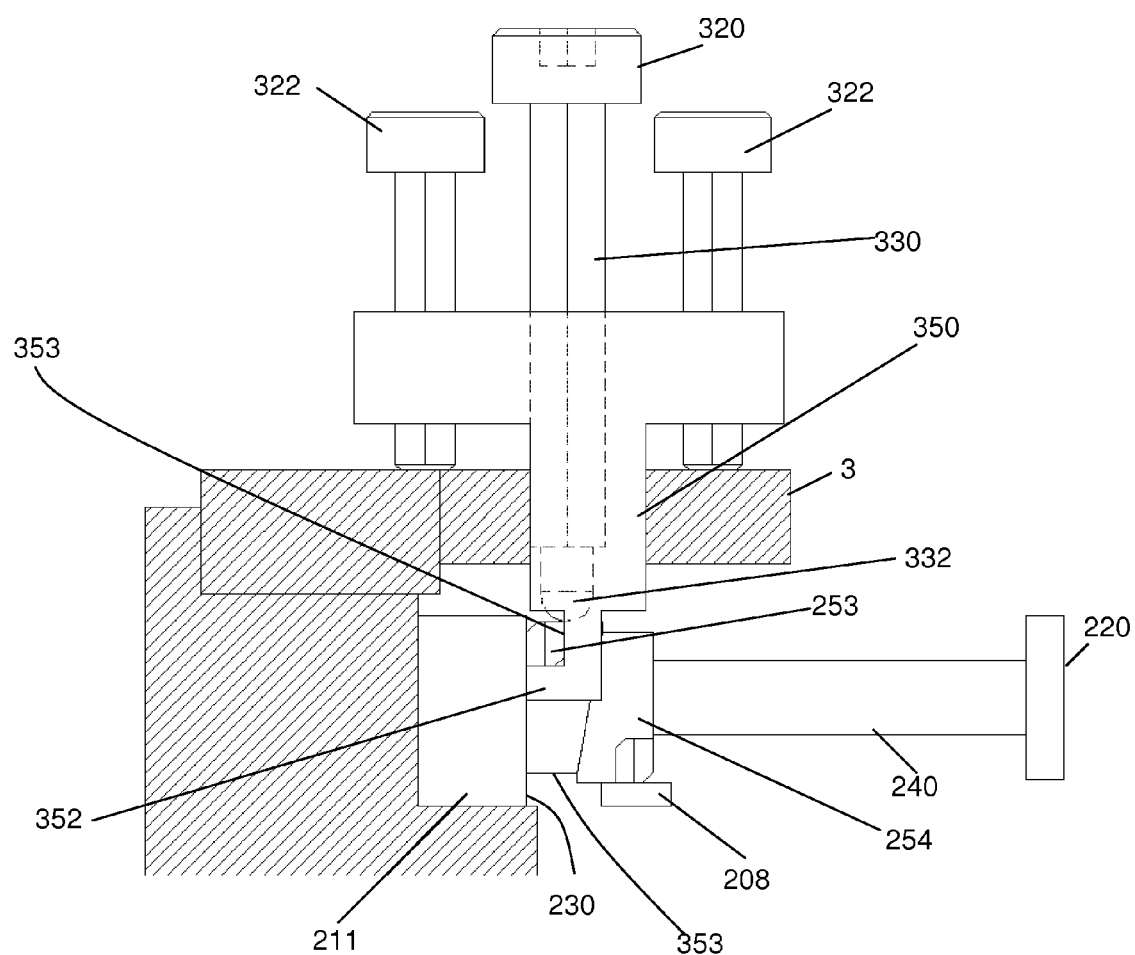
FIG. 6 is a cross-section through the line A-A of FIG. 5.
Figure 9:
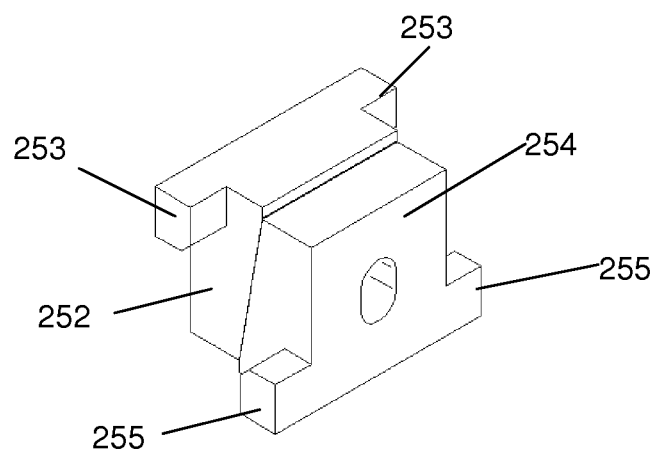
FIG. 9 shows the preload mechanism of FIG. 4 comprising wedges, each wedge having respective lugs for engagement with the jig as shown in FIG. 5.

Referring now to FIGS. 5 and 6, there is shown an apparatus for applying a preload force to the actuator 240. The apparatus is a jig 300 having a base 310 from which extends a clamp support 312. Extending in a horizontal plane from clamp support 312 is a tensioning platform 318 which is elevated with respect to the base 310. The tensioning platform 318 has a threaded through-bore (not shown) to receive a threaded shaft 330 of a tension adjustment screw 320. Positioned over tensioning platform 318 is a lifting platform 314, a bore 324 of which receives the shaft 330 of screw 320. Also received in lifting platform 314 are two smaller adjustment screws 322. A pair of legs 350 (only one of which is shown in the drawings) extends downwardly from opposite sides of the lifting platform 314. The legs extend from a position along the platform 314 which is approximately aligned with the bore 324. Each leg 350 has a foot 352 which defines, together with the remainder of the leg 350, a notch 353 sized and shaped to receive a lug 253 of wedge 252 (not shown in FIGS. 2 to 4, but visible in FIG. 9). Between the legs 350 is a gap which is approximately the width of tensioning platform 318.

To prepare the clamp 200 for preload force adjustment, the end portion 211 of the clamp body 210 is placed on recessed ledge 313 which is sized and shaped to accommodate the body end portion 211. Lifting platform 314 is then positioned by straddling the legs 350 over tensioning platform 318 and sliding it over the tensioning platform until bore 324 is aligned with the threaded bore of platform 318, and until the notches 353 of legs 350 align with and engage ears 253 of wedge element 252. Large tensioning screw 320 is then passed through the aligned bores and tightened until a rounded tip 332 at the lower end of shaft 330 contacts wedge 252. Small adjustment screws 322 are threaded into their respective bores until their lower ends contact the lifting platform 314 as shown in FIG. 6.

Once the jig 300 is assembled with the clamp 200 in place as shown in FIGS. 5 and 6, large tensioning screw 320 is tightened, in the process forcing wedge 252 downwards over wedge 254. Tightening can continue until a predetermined preload force is achieved in the actuator 240. If the preload force exceeds the desired force, it can be reduced by the use of small adjustment screws 322. Because the lower ends of small screws 322 are contacting and abutting against the platform 318, which is fixed, tightening them will tend to force the lifting platform 314 upwards. As lifting platform 314 is forced upwards, the feet 352 engage with lugs 253 and draw wedge 252 in an upward direction, thereby decreasing the preload force applied to actuator 240.

The magnitude of the preload force can be determined by measuring the separation between clamp plates 216 and 218, since the separation distance is directly proportional to the preload force. A calibration can be performed by measuring separation distance as a function of known preload force. Once the calibration curve is obtained, the preload force applied by the wedges can be determined by measuring the separation distance.

Figure 7:
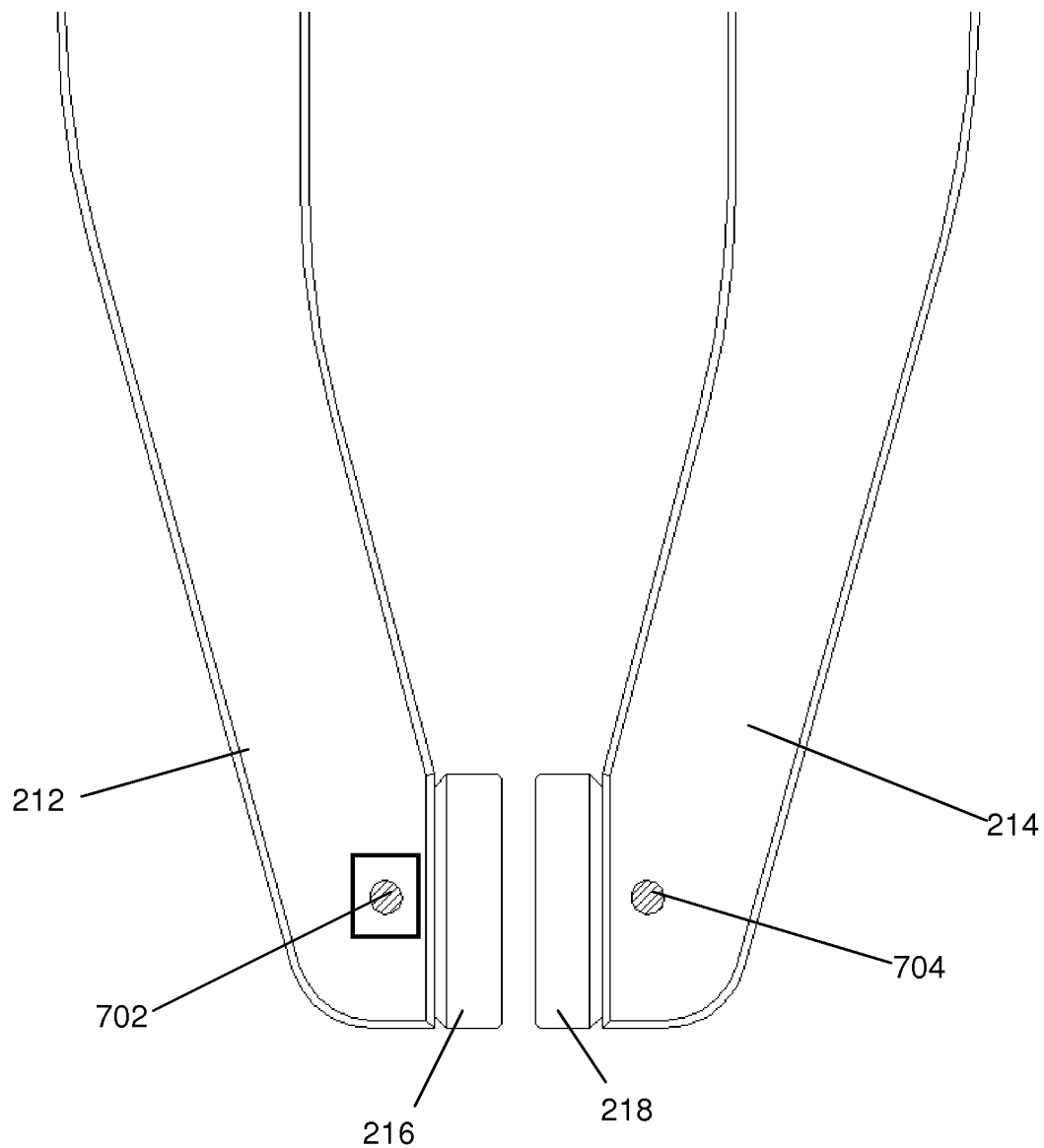
FIG. 7 is a projection view from above and in close-up of jaws of a wire clamp.
Figure 8A:
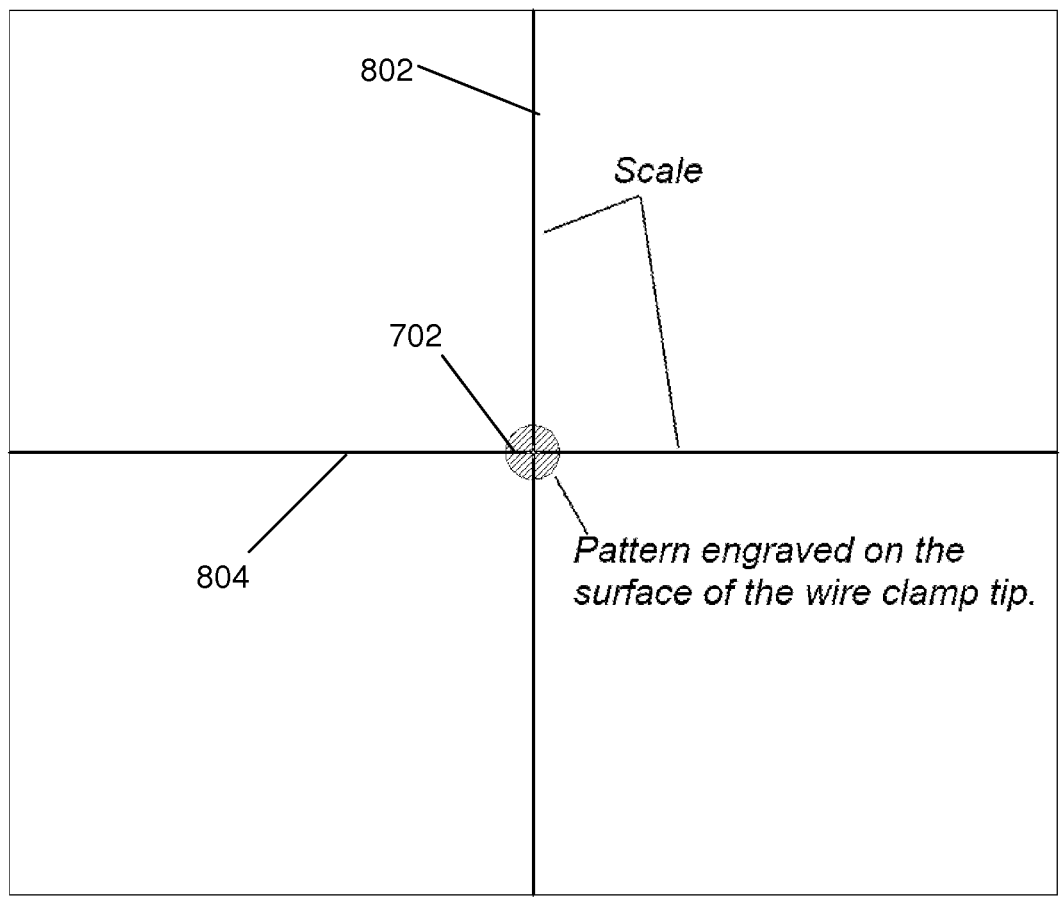
FIG. 8A and FIG. 8B schematically depict calibration markings used in a method according to embodiments of the invention.
Figure 8B:
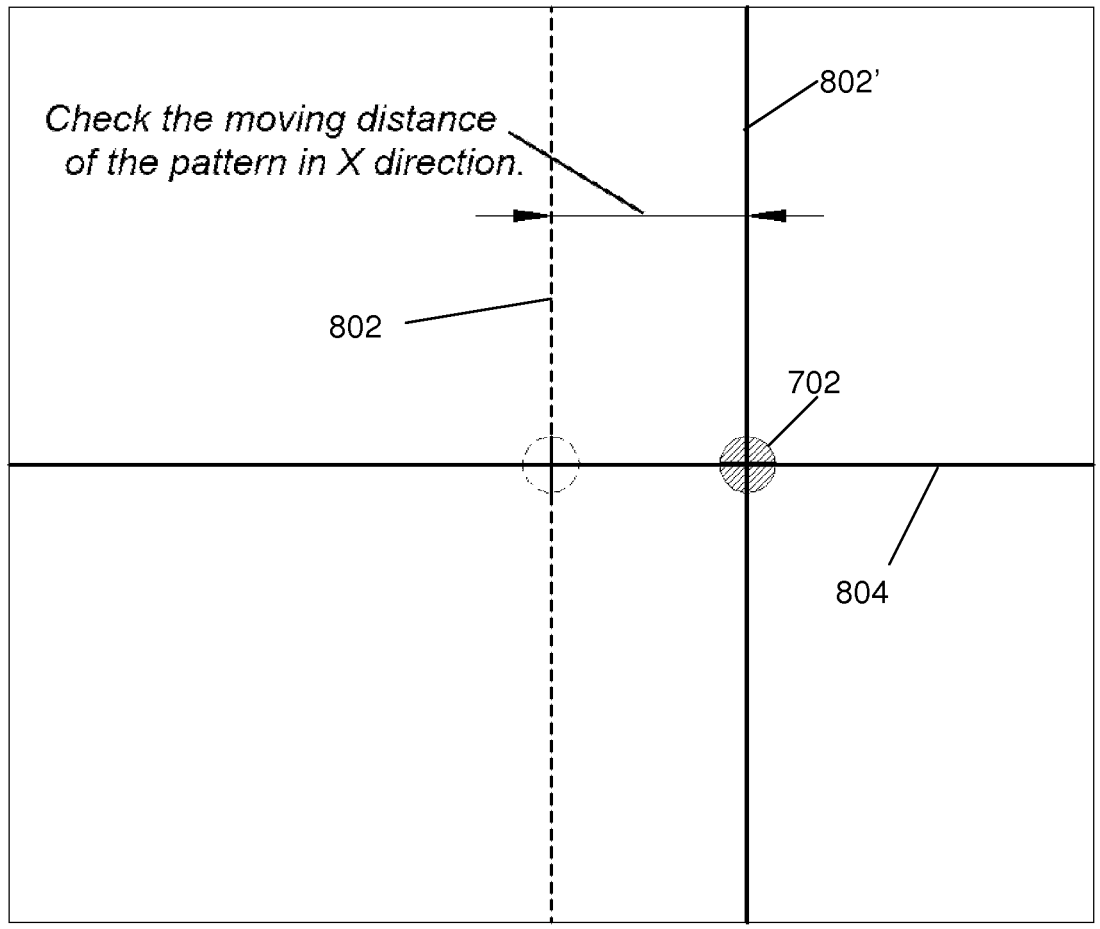

One way in which separation distance can be measured is depicted schematically in FIGS. 7, 8A and 8B. In FIG. 7, fiducial marks 702, 704 are applied near the tips of jaws 212, 214 adjacent the clamp plates 216, 218. The separation between clamp plates 216, 218 can then be measured by tracking the movement of one or both of the fiducial marks 702, 704. For example, a camera (not shown) can be mounted over fiducial mark 702. Image data from the camera may be received at a computer system which displays the captured image data on a display. An image processing module of the computer system may detect the fiducial mark 702 within the captured image, and determine its position as indicated by cross-hairs 802, 804 centred on the detected fiducial mark 702. The cross-hairs may be superimposed on the displayed image as shown in FIG. 8A. As the screw 320 is tightened and the clamp plates 216, 218 move further apart, fiducial mark 702 moves to the right, to a new position indicated by cross-hairs 802', 804. The measured distance d between the new x-coordinate (as indicated by vertical line 802') and the old x-coordinate (as indicated by dashed vertical line 802) can then be compared to the previously derived calibration curve to determine the preload force. The comparison can be done manually, or automatically, by the image processing module, for example.

Although particular embodiments of the invention have been described in detail, many variations are possible within the scope of the invention, as will be clear to a skilled reader.

The invention claimed is:

1. A wire clamp, comprising: a clamp body;
a pair of arms coupled to the clamp body; and
a piezoelectric actuator having a longitudinal axis extending between a first end and a second end, the actuator being coupled to the pair of arms at the first end and to the clamp body at the second end;
wherein the second end of the actuator is coupled to the clamp body by a preload mechanism for applying a preload force along the longitudinal axis, and
wherein the preload mechanism comprises at least one wedge having an inclined surface which is slidable over a mating inclined surface.

2. A wire clamp according to claim 1, wherein the inclined surface has an angle of inclination which is less than a critical angle required for self-locking.

3. A wire clamp according to claim 1, wherein the mating inclined surface is a mating inclined surface of another wedge.

4. A wire clamp according to claim 3, wherein the other wedge is removable from the clamp body.

5. A wire clamp according to claim 1, wherein the preload mechanism is disposed in a gap between the second end of the actuator and the clamp body.

6. A wire clamp according to claim 1, wherein the at least one wedge is slidably insertable into a gap between the mating inclined surface and the piezoelectric actuator, or a gap between the clamp body and the mating inclined surface, to apply the preload force.

7. A wire clamp according to claim 1, wherein the at least one wedge comprises at least one lug which is engageable to withdraw the at least one wedge from the wire clamp.

* * * * *